US007151701B2

(12) United States Patent
Combe et al.

(10) Patent No.: US 7,151,701 B2
(45) Date of Patent: Dec. 19, 2006

(54) SELF-ADAPTIVE PROGRAM DELAY CIRCUITRY FOR PROGRAMMABLE MEMORIES

(75) Inventors: Marylene Combe, Rousset (FR); Jean-Michel Daga, Rousset (FR)

(73) Assignee: Atmel Corporation, San Jose, CA (US)

(*) Notice: Subject to any disclaimer, the term of this patent is extended or adjusted under 35 U.S.C. 154(b) by 145 days.

(21) Appl. No.: 10/990,203

(22) Filed: Nov. 16, 2004

(65) Prior Publication Data

US 2006/0039207 A1 Feb. 23, 2006

(30) Foreign Application Priority Data

Aug. 17, 2004 (FR) .................................. 04 08930

(51) Int. Cl.
*G11C 7/06* (2006.01)

(52) U.S. Cl. ............................ 365/189.07; 365/185.2; 365/230.06; 365/189.09; 365/189.05

(58) Field of Classification Search ........... 365/189.07, 365/185.2, 230.06, 189.09, 189.05
See application file for complete search history.

(56) References Cited

U.S. PATENT DOCUMENTS 5,386,388 A 1/1995 Atwood ...................... 365/201
5,467,309 A 11/1995 Tanaka .................. 365/185.14
5,537,358 A 7/1996 Fong .......................... 365/218
5,627,784 A * 5/1997 Roohparvar ........... 365/189.01
5,751,637 A 5/1998 Chen ..................... 365/185.33
6,032,248 A 2/2000 Curry .......................... 712/37
6,166,962 A 12/2000 Chen et al. .............. 365/185.3
6,191,976 B1 2/2001 Smayling ................. 365/185.2
6,198,662 B1 3/2001 Chen et al. ............ 365/185.29
6,219,281 B1 4/2001 Chen et al. ............ 365/185.29
6,222,768 B1 * 4/2001 Hollmer et al. ........ 365/185.16
6,249,459 B1 6/2001 Chen et al. ............ 365/185.26
6,292,394 B1 9/2001 Cohen ................... 365/185.19
6,353,556 B1 3/2002 Chen et al. ............ 365/185.26
6,418,054 B1 7/2002 Hollmer .................. 365/185.2
6,483,751 B1 11/2002 Chen et al. ............ 365/185.26
6,834,323 B1 * 12/2004 Dover et al. ........... 365/185.03
2002/0031012 A1 3/2002 Chen et al. ............ 365/185.26

FOREIGN PATENT DOCUMENTS

JP 06068686 3/1994

* cited by examiner

*Primary Examiner*—Tuan T. Nguyen
(74) *Attorney, Agent, or Firm*—Schneck & Schneck; Thomas Schneck

(57) ABSTRACT

A self-adaptive programming circuit for EEPROM is used to automatically tune an erase or write delay, providing an improved programming window. The programming circuit may also provide improvements in data retention for programmed memory cells. The invention can be applied more particularly in the field of EEPROM memories capable of page mode writing operations.

26 Claims, 6 Drawing Sheets

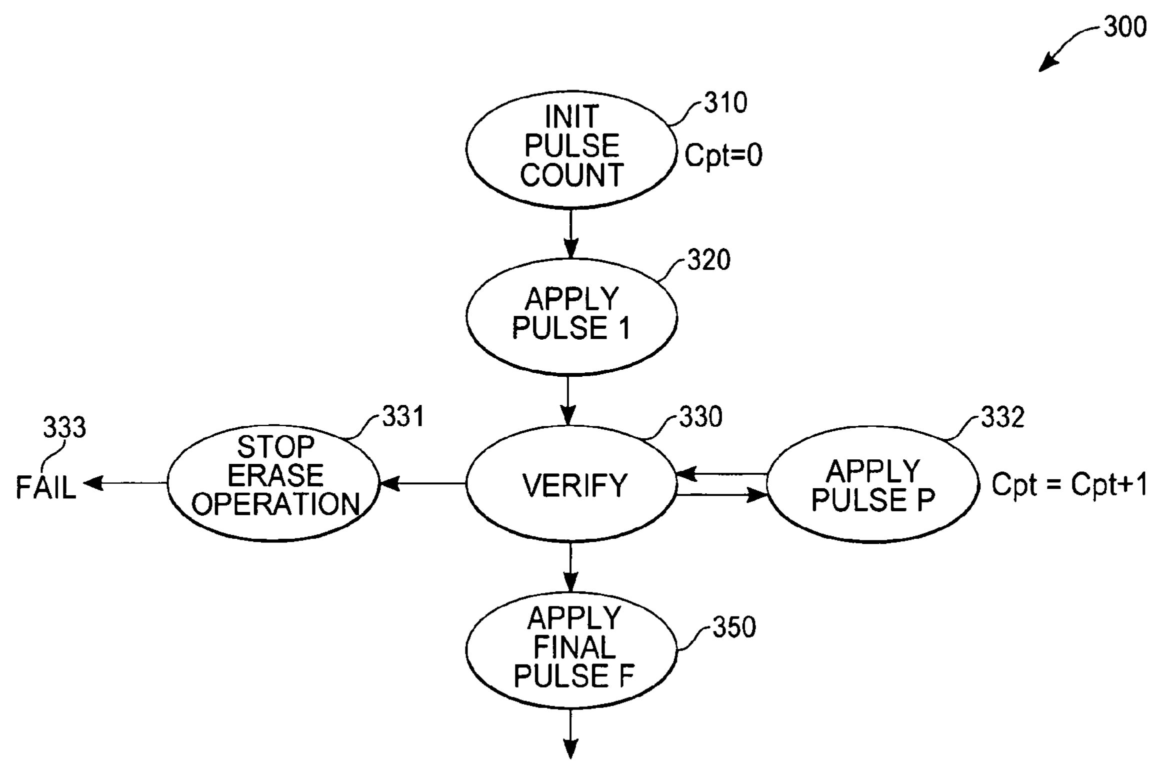
Fig._6
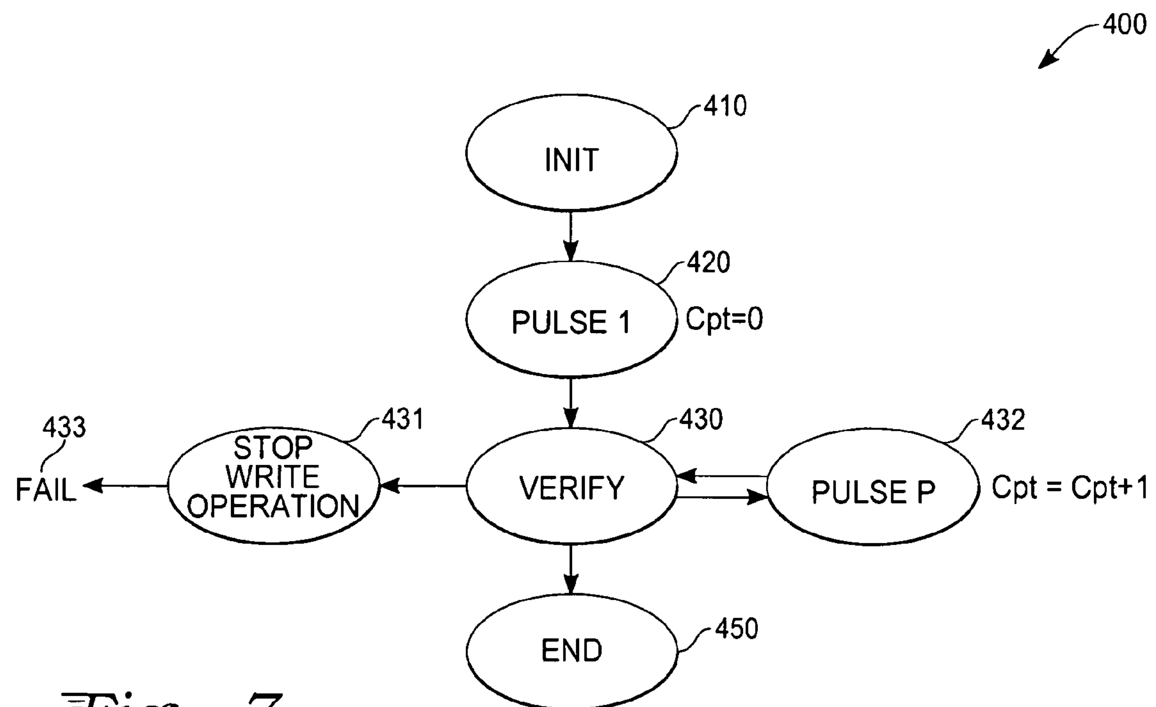
Fig._7

SELF-ADAPTIVE PROGRAM DELAY CIRCUITRY FOR PROGRAMMABLE MEMORIES

INCORPORATION BY REFERENCE

This invention incorporates by reference U.S. patent application Ser. No. 10/737,676, filed Dec. 15, 2003, and French application S.N. 03/10800, filed Sep. 15, 2003.

FIELD OF THE INVENTION

The present invention relates to integrated circuit memory architectures. More specifically, the invention relates to a new programming operation protocol and memory architecture for programmable memories allowing "intelligent programming."

BACKGROUND ART

FIG. 1 shows the array architecture of a programmable EEPROM memory, based on a matrix of rows and columns. Each row and each column correspond to a plurality of word lines $\mathbf{10}_1$, $\mathbf{10}_2$, . . . , $\mathbf{10}_n$, and a plurality of bit lines $\mathbf{20}_1$, $\mathbf{20}_2$, . . . , $\mathbf{20}_n$, (bits are accessible at $2^n$ bits per word) respectively. An exemplary memory cell 30 is located on each word line 10 and bit line 20 intersection. The memory cell 30 is composed of a select transistor 31 and a floating gate transistor 32 connected in series. The gate of the cell select transistor 31 is connected to the word line 10, its drain to the bit line 20, and its source to the drain of the floating gate transistor 32. A floating gate transistor source 34 is connected to ground via source line 35, and the floating gate transistor's gate 36 may be logically connected to a Vref line 40 when enabled by a word select device 11.

Data storage in a floating gate transistor is obtained by varying electrical charge that exists on the floating gate. To obtain a logical 1 value (erased state), electrons must be injected into the floating gate, which increases the threshold voltage of the floating gate transistor 32. To obtain a logical 0 value (written state), electrons must be extracted from the floating gate, which decreases the threshold voltage of the floating gate transistor 32. A mechanism referred to as Fowler Nordheim Tunneling is used for both erase and program operations on an EEPROM memory. This mechanism is very slow (in the millisecond range) and requires a high voltage source $V_{pp}$ that is generated by a circuit within the EEPROM memory chip. The $V_{ref}$ line 40 is driven to $V_{pp}$ during an erase operation and grounded during a write operation. The bit line 20 is left floating during an erase operation and connected to $V_{pp}$ during a write operation.

Erasing a cell is obtained by applying a high voltage $V_{pp}$ on the gate 36 of the floating gate transistor 32 (via word select device 11 and $V_{ref}$ line 40), and ground to the floating gate transistor's source 34 (by grounding source lines 35). To write the memory cell 30, $V_{pp}$ must be applied to the drain of the floating gate transistor 32 (via bit line 20 and cell select transistor 31), the floating gate transistor's gate 36 must be grounded (via word select device 11 and $V_{ref}$ line 40), and the floating gate transistor's source 34 is left floating (by floating source lines 35).

If memory cells 30 share the same $V_{ref}$ line 40, multiple memory cells may be grouped into words and may be erased in parallel. Also, each bit (memory cell) may be written independently by driving its corresponding bit line 20 to $V_{pp}$.

Word programming is obtained in two steps. First the word is erased and all of the erased bits are set to a logic 1 value after erase. Secondly, all of the necessary bits in the word are written at the same time, changing all bits to a logic 0 value in order to program the targeted word data.

With reference to FIG. 1, depending on the threshold voltage ($V_{th}$) of the floating gate transistor 32, each memory cell 30 will be conducting or not conducting current. If the threshold voltage $V_{th}$ is higher than the reference voltage $V_{ref}$, the memory cell 30 is OFF. If $V_{th}$ is lower than $V_{ref}$, the memory cell 30 is ON. A threshold voltage $V_{th}$ may be adjusted by injecting or removing electrons from the floating gate of each floating gate transistor 32 during a memory cell 30 or word programming operation. During an erase operation, electrons are injected into the floating gate resulting in a high threshold voltage value $V_{thhigh}$. During a write operation, electrons are removed from the floating gate, resulting in a low threshold voltage $V_{thlow}$. The difference between the high $V_{thhigh}$ and the low $V_{thlow}$ is referred to as a program window. The reference voltage value normally applied to the gate of a memory cell 30 during a read operation is between $V_{thhigh}$ and $V_{thlow}$. Due to a possible charge loss from the floating gate, after for example several years, a wide program window is desirable to prevent possible data loss.

The data retention characteristics of each memory cell 30 will depend on a capability of the memory cell 30 to reliably maintain voltage thresholds over time, due to an intrinsic floating gate charge loss. In addition, characteristics of a memory cell 30 may change after several erase and write cycles, resulting from a negative charge trapping phenomenon. These technical characteristics of the memory cell 30 make it difficult to guarantee an acceptable data retention capability.

Therefore, it is desirable to have a program window that is as wide as possible to compensate for characteristics of a programmable memory cell that may affect the integrity of data stored within a memory cell.

BRIEF DESCRIPTION OF THE DRAWINGS

FIG. 6 is a flow chart illustrating functions of an exemplary erase algorithm associated with a self-adaptive programming operation.

FIG. 7 is a flow chart illustrating functions of an exemplary write algorithm associated with a self-adaptive programming operation.

SUMMARY OF THE INVENTION

The present invention is a circuit to produce an automatically tuned programming pulse to compensate for a negative charge trapping phenomenon in the oxide of a floating gate transistor and to compensate for low supply voltage and temperature changes. The programming pulse is tuned according to programming conditions such as temperature and supply voltage. The memory is controlled as necessary to provide improved data reliability under a variety of conditions such as temperature and the number of times the floating gate transistor has been programmed. Using the tuned programming pulse results in better data retention capability even when using a part that has been repeatedly programmed. In addition, because the programming pulse is optimized, the power consumption is also optimized and the memory is stressed less. The present invention is also a method to program and verify a memory cell, using a read voltage that is different than a normal read voltage, after either an erase operation or write operation, and automatically adjusting the parameters of the programming pulse.

DETAILED DESCRIPTION OF THE INVENTION

The present invention is a self-adaptive programming operation that tunes the programming pulse delay time used in an erase or write operation, based on a read operation and comparison to an expected logic value for the memory cell 30. Erase and write delays are tuned automatically to maintain an acceptable program window under a variety of conditions. Increasing the programming pulse delay on a cycled part is a method used to recover an acceptable program window and to recover desired memory cell retention characteristics. For example, another programming pulse is applied after a comparison failure, when charges trapped in the oxide of the floating gate transistor 32 make the programming mechanism less efficient. Endurance, data retention, and power consumption characteristics may also be improved by the present invention.

Figure 1:
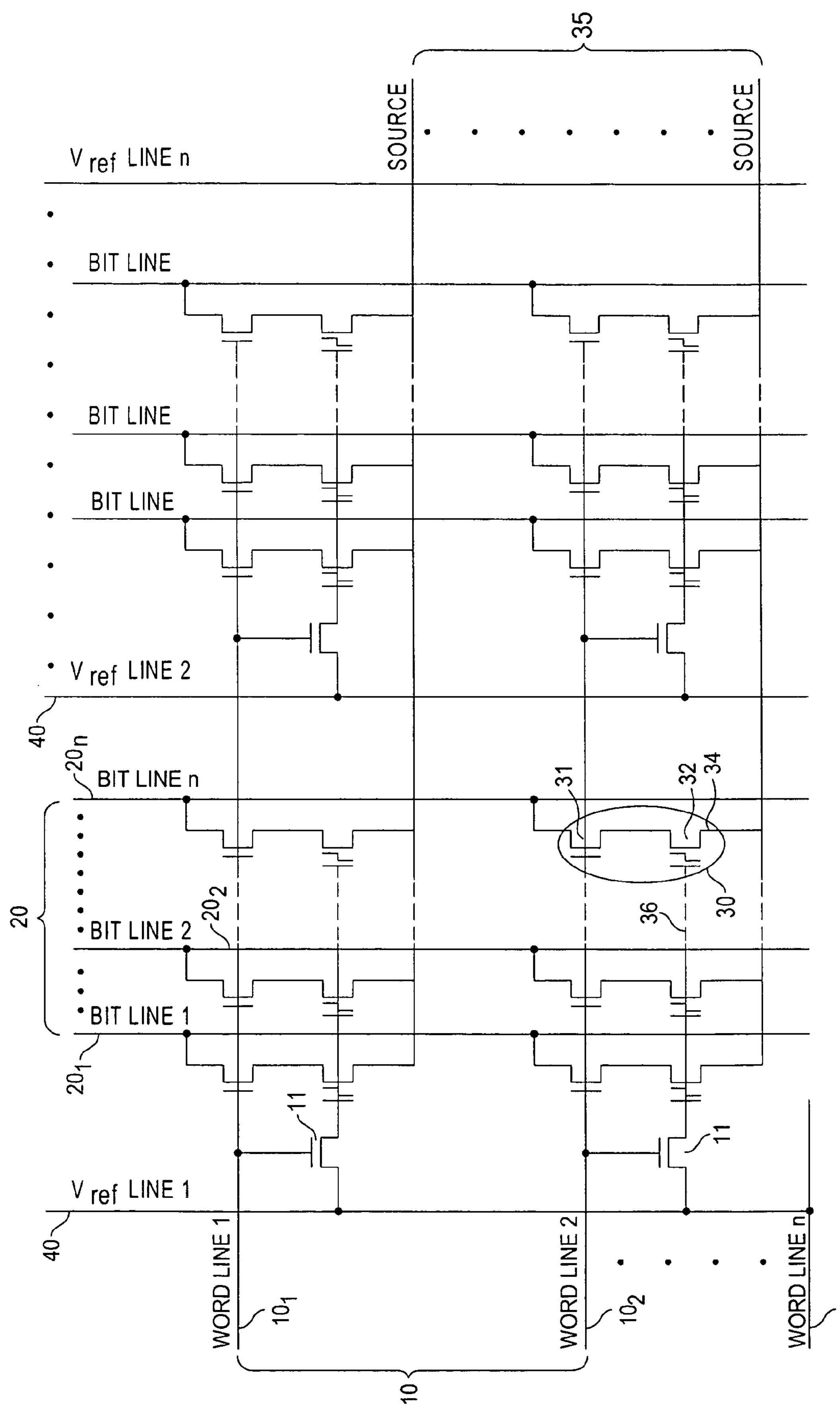
FIG. 1 is example of an EEPROM memory array of the prior art.
Figure 2:
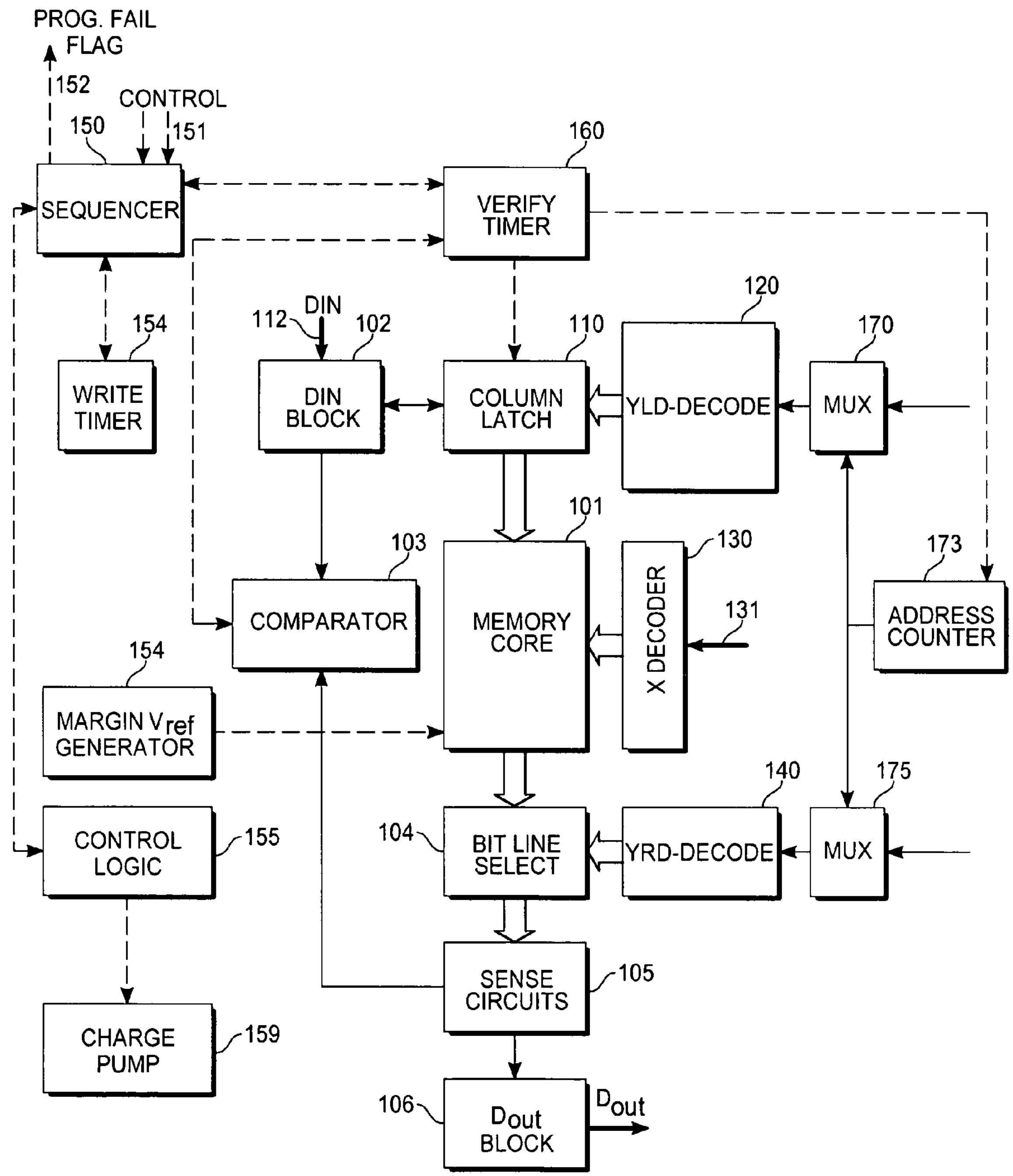
FIG. 2 is a block diagram of an EEPROM memory array (memory core) with additional exemplary circuitry used for a self-adaptive programming operation.

In an exemplary embodiment of the present invention, an automatic tuning of the number of programming pulses increases to compensate for an erase operation or write operation failure of any memory cell within a programmable EEPROM memory. With reference to FIG. 2, exemplary EEPROM memory device that contains a memory core 101, a "data in" block 102, a bit line select 104, column latch 110, address decoders 120, 130, 140, sense circuits 105, a charge pump 159, control logic 155, control lines 151, and a write timer 154. In addition, a program failure flag 152, a dedicated sequencer 150, dedicated latch circuitry, a verify timer 160, an address counter 173, multiplexers 170, 175, comparator 103, and a margin reference voltage ($V_{ref}$) generator 154 are necessary to implement the self-adaptive programming. The memory core 101 represents an array architecture similar to the array architecture of an EEPROM memory as shown in FIG. 1.

In the exemplary embodiment, sequencer 150 is a state machine used to implement an embodiment of a programming algorithm (details of the programming algorithm are described in detail with respect to FIGS. 6 and 7). In alternate embodiments, the functions of a sequencer 150 may be performed by a dedicated controller or by a processor. The sequencer 150 is connected to control logic 155, and to write timer 153. The control logic 155 turns charge pump 159 on or off to provide voltage $V_{pp}$. The write timer 154 controls a programming pulse width. The sequencer 150 delivers erase and write pulses to the write timer 154. During a verification operation, the address counter 173 generates a required addresses beginning at a first address. Addresses are provided to the Yld 120 and Yrd 140 address with and decoders via multiplexers 170, 175. Any erased memory cell 30 should be equal to a logic 1 value. An erased word logic value should be equal to a group of $2^n$ bits, each bit having a logical 1 value. For example, an eight bit word should have a hex value of FF after an erase operation. The comparator 103 also compares a memory cell 30 or word in the memory array that has been written to the content of column latches containing an expected data or logic value.

The content of at least one programmed memory cell 30 is verified automatically (see further details below) and a programming operation is completed when a verification of a programmed memory cell 30 is successful. A read margin mode test is used to verify the quality of a programming operation. A margin voltage reference is used in a read margin mode test. The voltage reference $V_{ref}$ is increased when reading OFF cells and decreased when reading ON cells and comparison to a normal read voltage reference. For example, a margin of approximately ±0.5 volts is used. Using a margin voltage reference during a read operation guarantees that the memory cell stays OFF when memory cell 30 is read with Vref+0.5V on its gate, and the memory cell stays ON when memory cell 30 is read with Vref−0.5V on its gate. During a verification operation, a word in the memory core (array) 101 is read using a margin mode by applying an internally generated $V_{ref}$ value by the margin $V_{ref}$ generator 154.

A programming operation that programs a logic value in at least one memory cell 30 is divided in three phases or operations: load, erase, and write.

Programming current for a single cell is very small, making programming several bits in parallel possible. To improve the programming speed of EEPROM memory, it is possible to erase or write several words in the same row or multiple words in a page at the same time. However, the data to be programmed must be loaded into a dedicated buffer (latch) before starting a parallel write operation. A column latch 110 buffer system is composed of one column latch 110 per bit line 20 and one column latch per $V_{ref}$ line 40. In an exemplary embodiment, there is a column latch 110 for each bit line 20 and a column latch 110 for each $V_{ref}$ line 40. A memory core 101 having a column latch 110 coupled to each bit line provides an erasure operation by word (one or more bits), and a selective write operation (by bit or by word).

The column latch 110 provides two functions. The column latch stores data and also brings $V_{pp}$ to a corresponding bit line 20. Data to be programmed into a memory cell 30 is loaded into at least one column latch 110. A group of $2^n$ bit latches and one $V_{ref}$ latch (or byte flag) store the data to be programmed on a targeted row. During a load operation, the Yaddress bus AddYld 171 is decoded by the Ydl-decoder 120. A data value is loaded into at least one word of column latches 110 coupled to the bit lines 20. A logical value (flag signal) is also stored in an associated $V_{ref}$ column latch. Words that will be used to program memory cells 30 are selected by using the flag signal loaded into the associated $V_{ref}$ column latches 110. Word lines are selected by an Xaddress on Xdecoder input 131, which is decoded by an Xdecoder 130. When all of the data words have been loaded, erase voltages are applied on selected words.

Figure 3:
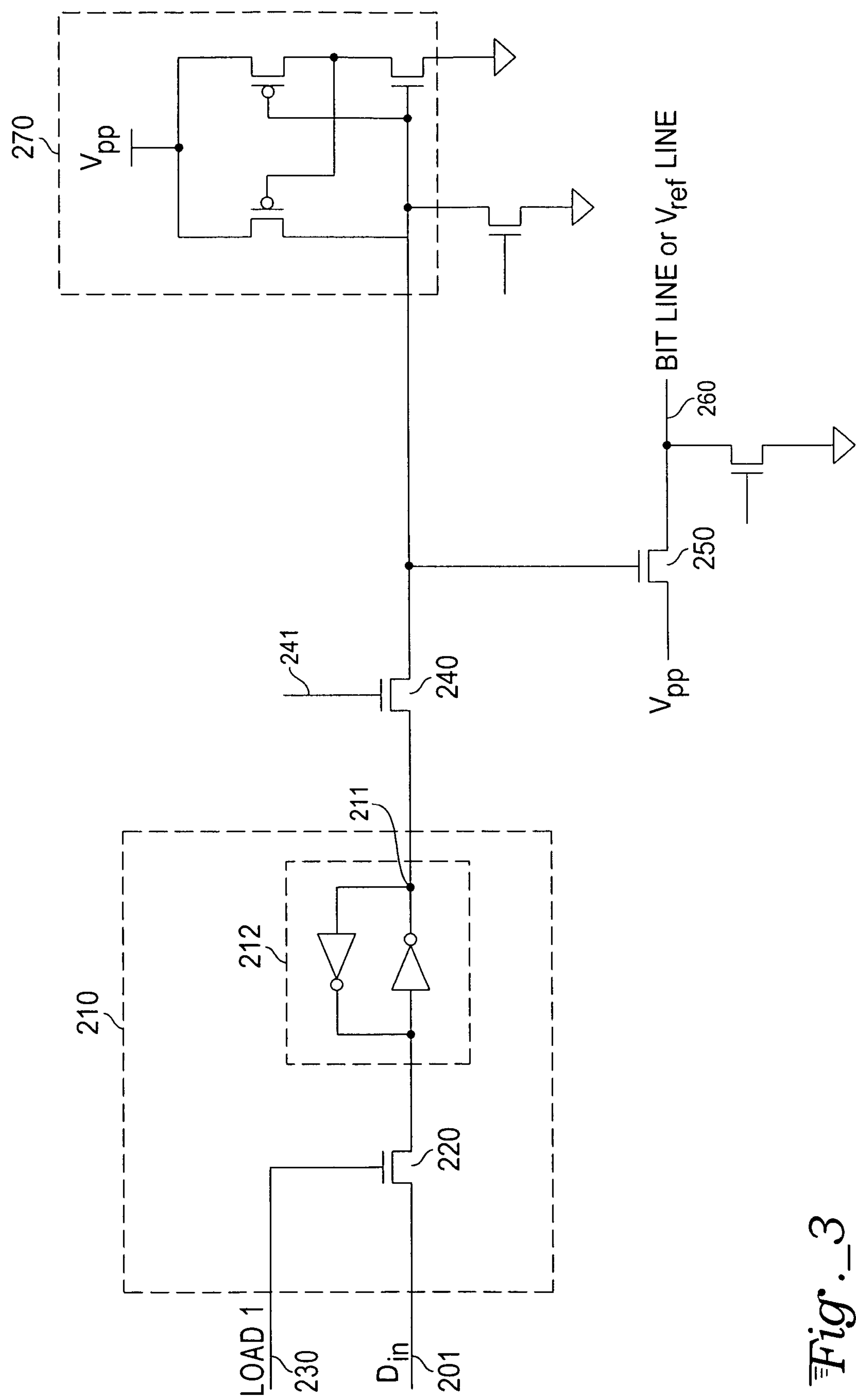
FIG. 3 is a column latch circuit associated with a self-adaptive programming operation of FIG. 2.

The latch circuit may be incorporated into the column latch 110 block shown in FIG. 2. FIG. 3 illustrates circuits disclosed in U.S. patent application Ser. No. 10/737,676 titled "EEPROM Architecture and Programming Protocol" that may be used in an embodiment of the present invention. The latch circuit comprises a pass transistor and a pair of feedback inverters to provide a state latch 210 operation. Column latch 210 may be used during an erase operation and/or a memory write operation. The column latch circuit 210 includes a state latch 212 and a state latch pass transistor 220 that is controlled by a load control signal applied to a gate 230 of the state latch pass transistor 220. In addition, the column latch circuit 210 includes circuitry to provide reference and programming voltages $V_{pp}$. Data control pass gate 240 is coupled to the latch output 211, and controlled by a data control input 241. The data control pass gate 240 is coupled to a level shift circuit 270 to provide a voltage to the memory array different than the voltage used in the state latch circuit 210. The data control pass gate 240 is also coupled to a $V_{pp}$ pass gate 250 to apply a $V_{pp}$ voltage to a column (bit line 20).

During the load period, an input data on input Din 201 is input to the column latches 110 using the Yld decoder 120. A load control signal is applied to a gate 230 of the state latch pass transistor 220 is set to a logic 1 value in order to latch a data input value via Din 201 into at least one state latch 212. The loaded data is a logic 1 value to program a memory cell 30 that is OFF, and a logic 0 value to program a memory cell 30 that is ON. In addition, a logic 1 value is loaded into a $V_{ref}$ latch corresponding to each word to be programmed. The loading period ends when all the words at each desired address have been loaded one by one into each latch that corresponds to a memory cell 30 targeted for a programming operation. Address counter 173 is used to count or increment a memory core address as part of a verify operation. AddYint 172 may start from address location 1, and is decoded by both the load and read decoders 120, 140.

Next after completing a load operation, memory cells 30 are erased as $2^n$ bit words in parallel. In the erasure stage, electrons are injected into the floating gate structure by holding the gates of floating gate transistor 32 (in FIG. 1) at an elevated voltage $V_{pp}$. A $V_{pp}$ voltage is provided by at least one $V_{ref}$ column latch through the word select pass gate 11. To implement an erase operation, the X Decoder 130 as shown in FIG. 2 applies $V_{pp}$ on a word line corresponding to an AddX address (corresponding to word line 11 in FIG. 1). The data control pass transistor 240 is toggled ON, the $V_{ref}$ column latch 210 drives or turns the (voltage) level shifter circuit 270 on, and applies $V_{pp}$ via bit line pass transistor 250 to the control $V_{ref}$ line(s) 40.

The required erase voltage $V_{pp}$ is applied as a pulse having an applied duration. The applied duration is referred to as an erase time delay Terase. Application of the $V_{pp}$ voltage pulse causes electrons to accelerate to the selected floating gates 320. The increase in electrons that are held in the floating gate increases the cell's voltage threshold $V_{th}$. The selected words are then erased and each selected bit is set to a logic value of 1. After the erase operation is completed, an erase verification operation is executed 300 as illustrated by the exemplary algorithm in FIG. 6 (described further below).

After an erase operation is completed, a write operation may be executed. During a write operation, the X decoder 130 (via word select device 11) applies $V_{pp}$ on the word line(s) 10 selected by AddX on Xdecoder input 131. As shown in FIG. 3, $V_{pp}$ pass transistor 250, controlled by column latch 210 and applying a control signal 241 to the gate of pass transistor 240, applies $V_{pp}$ to bit lines 20 (in FIG. 1) that have been selected. In each column latch 210, the content of each state latch is connected to the input of the level shift circuit 270 when the data control pass transistor 240 turns ON by driving the data control input 201. If the state value of latch output 211 is a logic value 0, then the gate of $V_{pp}$ pass gate 250 retains a logic 0 value, and the bit line 260 is left floating. In the case when the state latch output 211 is a logic value 0, a corresponding memory cell is not written, and remains at a logic 1 value after an erase operation has been completed. If the state latch output 211 is a logic value 1, then $V_{pp}$ pass gate 250 is switched to $V_{pp}$ by level shift circuit 270. In the case when the state latch output 211 is a logic value 1, $V_{pp}$ pass gate 250 is conducting, and voltage $V_{pp}$ is transmitted to bit line(s) 260. The selected memory cell is written and a logic value of the memory cell is changed to a logic 0 value.

When the write operation is completed, the write operation is then automatically verified. The written memory cell 30 is read and its value is compared with an expected data value stored in a corresponding latch.

A verification operation is performed after an erase operation or after a write operation has been performed. A verification operation reads at least one memory cell 30 and compares the contents of the memory cell 30 with an expected value. For an erase operation, the expected value of each memory cell is a logical 1 value. An erased word logic value should be equal to a group of $2^n$ bits, each bit having a logical 1 value. For example, an eight bit word should have a hex value of FF after an erase operation. Erased words, for example, will be compared to the value FF. For a write operation, an expected value is the logical value that is stored in the column latch 110, 210 associated with each memory cell 30. Both the logical value that is stored in at least one column latch 110, 210 and the value that is stored in at least one memory cell 30 are read. When verifying a write operation, the logic value of the memory cell 30 is compared to the logic value that is stored in the corresponding column latch 110, 210.

In a memory cell 30 read operation, a reference voltage $V_{ref}$ is applied to the gate of floating gate transistor 32. The reference voltage may be a normal reference voltage or a margin reference voltage. The drain current of floating gate transistor 32, measured by sense circuits 105 (in FIG. 2) indicates whether there are stored electrons in the floating gate of the floating gate transistor 32. A programmed cell draws less drain current than a reference cell indicating a stored logic 0 value.

In an exemplary embodiment of a read operation, a reference voltage $V_{ref}$ is applied via word select device 11 to the gate 36 of each selected floating gate transistor 32. Additionally, voltage $V_{dd}$ is applied to the gate of select transistor 31. A floating gate transistor 32 is selected by an activated word line 10 and by activated bit line 20. The bit lines 20 are connected to sense circuits 105 through the bit line select circuit 104. In an alternate embodiment for low voltage applications, twice the $V_{dd}$ value is applied to the gate of select transistor 31. A voltage under 1 volt is applied to the drain of the word select transistor 11.

Figure 4:
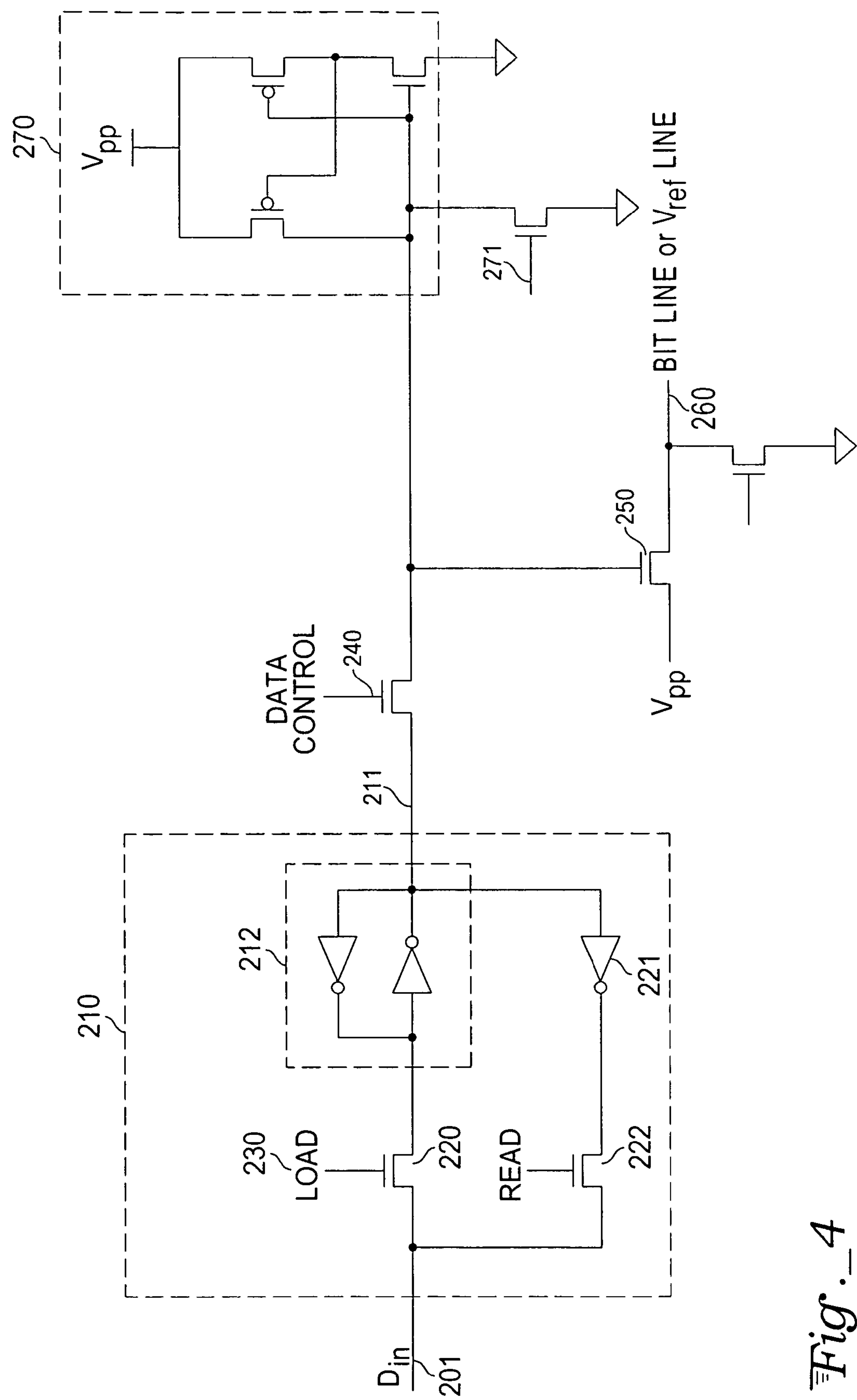
FIG. 4 is the column latch of FIG. 3 with an exemplary verify function.

FIG. 4 illustrates an exemplary embodiment of a column latch circuit 210 containing additional circuitry that may be used during a column latch read operation. In a read operation, the Xaddress decoder 130 and Yaddress decoder 120, 140 specify locations of a memory cell 30 and a column latch 210 to be read. Inverter 221 is used to isolate output line 211 from data line Din 201. This prevents connecting the output of the state latch 212 directly to the capacitive load of data line Din 201. Without inverter 221, inadvertent switching of state latch 212 may occur from a capacitive charge transfer. For the same reason, the content of state latch 212 cannot be read directly through state latch pass transistor 220. To perform a read operation of the state latch 212, a read pass transistor 222 is activated and the state of state latch 212 is read on the data line Din 201.

A verification process is executed when a memory word is read and compared to an expected logic value. For example when verifying whether a memory cell 30 has been properly erased, the expected word value is, for example, FF. In an exemplary embodiment, the comparison is performed via a dedicated comparator 103. The verification process is automatically executed after a word or plurality of words in the memory array have been erased or written. Comparator 103 (shown in FIG. 2), compares an erased word's bits to a logic 1 value, and compares a written word to the content of the column latches. For a write operation verification, the logic values of programmed data have been loaded into the column latches 210 and are readable.

Figure 5:
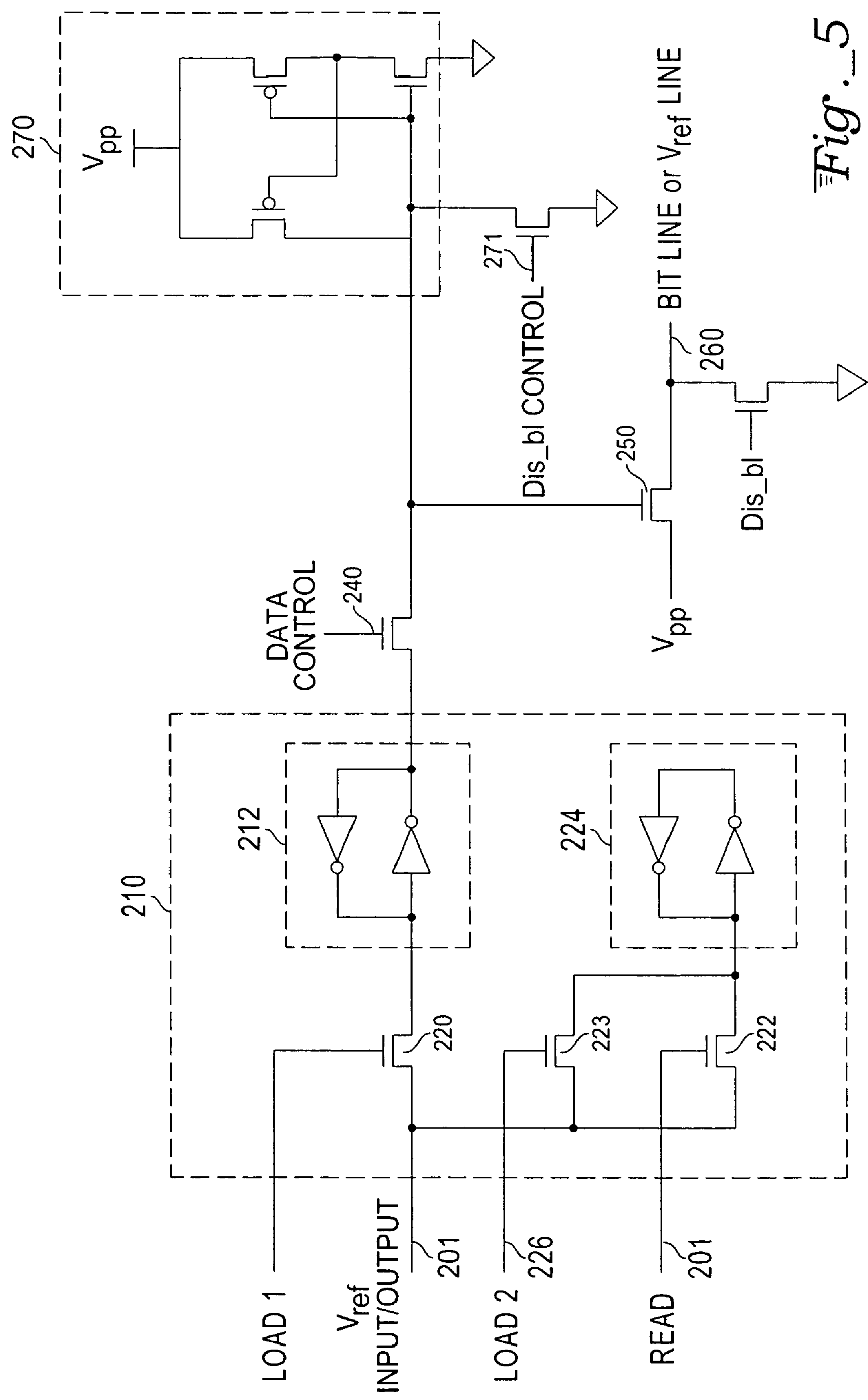
FIG. 5 is the column latch of FIG. 4, with an exemplary selective Vref column latch.

FIG. 5 illustrates an exemplary embodiment of a selective $V_{ref}$ column latch 210 that contains a separate tag latch 224. Tag latch 224 is used as a $V_{ref}$ tag or word latch. If the $V_{ref}$ tag has been set to a logic 1 value, the tag indicates that the corresponding memory word has been erased. Tag latch 224 may be loaded using the load tag line 226, which controls tag pass transistor 223. Load tag line 226, may be operated in conjunction with state latch load 230 to load the same state when state latch pass gate 220 is active and Din 201 is stable. Alternatively, the load tag line 226 may be used separately to load a separate tag logic value into tag latch 224. A separate read tag line 225 controlling tag pass transistor 222 reads the stored value in the tag latch 224 during a read operation.

During a verification operation performed during both the erase and write operations, a cell is read using a dedicated margin mode operation and compared to an expected logic 1 value for erased cells or alternatively, the data stored in column latches 110 for written cells. The dedicated read margin mode ensures that memory cells 30 are programmed with enough margin to maintain a set logic value over time regardless of the floating gate transistor 32 that is susceptible to natural charge variations. To verify the quality of a programming operation, $V_{ref}$ is increased when reading OFF cells and decreased when reading ON cells. During the margin mode read operation, reference generator 154, as shown in FIG. 2, generates an internal reference voltage that is higher than a voltage used in a normal read operation. For example, a margin of approximately 0.5 volts guarantees that a memory cell 30 stays OFF when reading a particular memory cell 30 with Vref+0.5 volts on its gate and stays ON when reading a particular memory cell 30 with Vref−0.5 volts on its gate.

A verification operation may be performed using more than one method. A margin mode read operation verifies that the voltage threshold $V_{th}$ of each cell is high enough to overcome any floating gate variations that are related to environmental conditions (for example, temperature) or to an undesired storage of electrons (for example, trapped oxide charges).

In FIG. 6, and exemplary erase algorithm using an automatic verification operation is shown. After initializing a pulse counter 310, a first erase pulse is applied 320 to the target cells 30. A verify operation 330 initializes an address counter. If memory cells 30 have been properly erased, an address counter 173 is incremented and another group of memory cells is verified. If the memory cells have not been properly erased, another pulse is applied 332, the pulse counter is incremented 332, and the memory cells are verified again 330. If a predetermined pulse counter value is reached, the verify operation 330 will stop, the erase operation will stop 331, and a program failure flag 152 will be set 333. If all of the memory cells 30 pass the erase and verification operations, a final erase pulse may optionally be applied 350.

In one embodiment, speed is optimized in the verification operation. If the comparison result confirms that the threshold voltage $V_{th}$ for a verified cell or word is correct, Addyint is incremented and the next erase and verification operation is performed on the next word 330. If the threshold voltage $V_{th}$ for the verified cell or word is not correct, at least one cell is not well erased. When the verify procedure fails, the erase pulse is then applied 332 again to of all the words to be programmed—even to those that successfully passed a previous verify operation. Additional erase and verify 330 operations are performed until all of the cells pass verification or until a maximum number of erase pulses have been reached. When the previously failed cells subsequently pass verification, an erase time is optimized. If the erase time maximum is reached by the verify timer 160 (in FIG. 2) and the cells have not passed verification 330, the verify operation using a margin mode stops 331 and sequencer 150 (shown in FIG. 1) sets 333 a programming failure flag 152. If all of the cells pass the verification operation (using a margin mode) 330, meaning that the desired erase time has been reached, a write phase then begins 410. The option of applying a final erase pulse 350 using an optimized erase time may be executed.

When the erase time has been optimized, the high voltage condition for a memory cell 30 erase has been applied to all the words to be programmed. Although this verification procedure quickly optimizes the erase time, words that have been previously erased will be erased again each time the program increments the erase time counter. The result may unnecessarily over-stress previously erased cells.

Referring again to FIG. 6, an alternative embodiment of a verification operation may be implemented that avoids unnecessary stress on correctly erased words. Using the modified $V_{ref}$ column latch 210 (shown in FIG. 5), tag latch 224 (in FIG. 5) stores an independent tag indicating that the word has been erased at least once. When a word address is loaded, the tag is latched as an indication that the word has not passed verification. The $V_{ref}$ column latch will pass $V_{pp}$ during the first erase pulse. At the application of the first erase pulse 320, each word to be programmed is erased. Next, the words are read in margin mode during a verification operation 430. After the first erase pulse has been applied 320, the erase voltage Vpp is selectively applied to only words that are not well erased (words that fail during the verification).

If a word fails a verification operation, the tag latch 212 is set to indicate a verification failure. The verification operation proceeds until all the words in memory have been verified. During a verification operation, any properly erased word will not be erased again during an application of a subsequent erase pulse 350. An erase pulse 350 will be applied to all the words in the memory core that have failed verification if at least one $V_{ref}$ column latch data is set, meaning that at least one word is not correctly erased. When a new erase pulse is applied 350, $V_{pp}$ will not be applied to properly erased words because the corresponding $V_{ref}$ column latches have been set during the verification operation. The tag latch 224 state is maintained and will be used during the verification procedure of a subsequent write phase.

As illustrated in FIG. 7, during a write phase 400, the application of write voltages 420 are applied to selected cells and a write verify 430 will be performed after each writing pulse. The operation of a write verification operation is similar to the erase verification described above. The address counter 173 (in FIG. 2) that provides an AddYld 171 and AddYrd 176 address is initialized 410. Similar to an erase verify operation, the $V_{ref}$ column latch 210 or 224 is read. If the $V_{ref}$ column latch 210 has not been set, indicating that the corresponding word is not programmed, the Y internal address is incremented. If the $V_{ref}$ column latch 210 has been set, the content of the column latch word corresponding to the data to be written is read. The selected word in the memory core 101 that has been written is read in margin mode 430 and compared to the state of the column latch 212. To verify that ON cells are programmed with enough margin, the gates of the memory cells 32 are grounded via each pass gate 31 to each bit line.

If the latch and memory cells do not match, the comparison stops 431, indicating that at least one cell has not been correctly written. If a memory cell 30 fails the verification operation and a maximum number of verify iterations has been reached, the verify operation stops 431 and sequencer 150 (shown in FIG. 1) sets 433 a programming failure flag 152.

If the contents of the latch and memory cell comparison match, the address counter 173 (in FIG. 2) is incremented 432. After each verification operation, column latches 210 corresponding to the words that are correctly written can be reset in order to avoid unnecessary over-write of the word. As each memory cell passes the verification operation, the address counter is iteratively incremented 432 and another write pulse is applied 432, followed by a verify procedure 430. When all desired memory cells have passed the verify procedure, the write process ends 450.

The proposed invention is the first architecture to provide an intelligent and automatic, self-adaptive EEPROM memory cell programming operation that performs a parallel-write operation. Using specific column latches, dedicated timers, and an internally controlled verify procedure, it is possible to reduce the number of pulses and time required to complete erase and write operations. Using this method, a verification operation adapts to programming conditions such as power supply and temperature variations, individual memory cell programming variations due to cell distributions across the array, and memory cell degradation after repeated erase and write cycles. In addition, the programming power consumption may be optimized, while ensuring reliable program operations over a variety of program conditions. Finally, if a memory cell programming issue occurs, it is detected and a dedicated memory program failure flag is set.

It is to be understood that the above description is intended to be illustrative, and not restrictive. Those of skill in the art will recognize that the invention can be practiced with modification and alteration within the spirit and scope of the appended claims. Embodiment(s) of the invention so described may include a particular feature, structure, or characteristic, but not every embodiment necessarily includes the particular feature, structure, or characteristic described. Repeated use of the phrase "in one embodiment" does not necessarily refer to the same embodiment, although it may. Many other embodiments will be apparent to those of skill in the art upon reading an understanding the above description. For example, the present invention would apply to types programmable memory, other than an exemplary EEPROM. The description is thus to be regarded as illustrative instead of limiting. The scope of the invention should, therefore, be determined with reference to the appended claims, along with the full scope of equivalents to which said claims are entitled.

What is claimed is:

1. A method to improve data retention in an array of programmable memory cells comprising:

defining a margin reference voltage that is different than a normal memory cell read voltage;

reading a logic value content of at least one memory cell;

using said margin reference voltage as a reference for comparison with said logic value content;

comparing said logic value content of the at least one memory cell automatically to an expected logic value; and adjusting a programming parameter automatically if said memory cell logic value content is different than said expected logic value.

2. The method of claim 1, wherein said at least one memory cell within said array of programmable memory cells maintains a set logic value regardless of a natural charge variation in a floating gate.

3. The method of claim 1, wherein said margin reference voltage differs by approximately +0.5 volts compared to said normal memory cell read voltage.

4. The method of claim 1, wherein said margin reference voltage differs by approximately −0.5 volts compared to said normal memory cell read voltage.

5. The method of claim 1, wherein said margin reference voltage is higher than said normal memory cell read voltage when reading memory cells expected to be in an "off" state.

6. The method of claim 1, wherein said margin reference voltage is lower than said normal memory cell read voltage when reading memory cells expected to be in an "on" state.

7. The method of claim 1, further comprising applying an adjusted programming pulse operation to the at least one memory cell within said array of programmable memory cells.

8. The method of claim 1, wherein said method is performed after an erase operation has been performed.

9. The method of claim 8, wherein an adjusted programming pulse is applied to a plurality of memory cells within said array of programmable memory cells if said memory cell logic value content is different than said expected logic value.

10. The method of claim 8, wherein an adjusted programming pulse operation is only applied to any memory cell having a different logic value content if said memory cell logic value content is different than said expected logic value.

11. The method of claim 8, wherein an indicator tag associated with said memory cell having a different logic value is latched if said memory cell logic value content is different than said expected logic value.

12. The method of claim 1, wherein said method is performed after a write operation has been performed.

13. The method of claim 12, wherein an adjusted programming pulse is applied to a plurality of memory cells within said array of programmable memory cells if said memory cell logic value content is different than said expected logic value.

14. The method of claim 12, wherein an adjusted programming pulse is only applied to any memory cell having a different logic value content if said memory cell logic value content is different than said expected logic value.

15. The method of claim 12, wherein an indicator tag associated with said memory cell having a different logic value is latched if said memory cell logic value content is different than said expected logic value.

16. The method of claim 1, wherein adjusting said programming pulse parameter is defined as increasing a pulse duration.

17. A machine readable medium having stored therein instructions for use in a machine to improve data retention in an array of programmable memory cells, the instructions comprising:

instructions to define a margin reference voltage that is different than a normal memory cell read voltage;

instructions to read a logic value content of at least one memory cell;

instructions to use said margin reference voltage as a reference for comparison with said logic value content;

instructions to compare said logic value content of the at least one memory cell automatically to an expected logic value; and instructions to adjust a programming parameter automatically if said memory cell logic value content is different than said expected logic value.

18. A machine readable medium of claim 17, wherein said instructions are performed after an erase operation has been performed.

19. The machine readable medium of claim 18, wherein at least one instruction is executed to adjust a programming operation applied to a plurality of memory cells within said array of programmable memory cells if said memory cell logic value content is different than said expected logic value.

20. The machine readable medium of claim 18, wherein at least one instruction is executed to adjust a programming operation applied to only the memory cell having a different logic value content if said memory cell logic value content is different than said expected logic value.

21. The machine readable medium of claim 18, wherein at least one instruction is executed to latch an indicator tag associated with said memory cell having a different logic value if said memory cell logic value content is different than said expected logic value.

22. The machine readable medium of claim 17, wherein said instructions are performed after a write operation has been performed.

23. The machine readable medium of claim 22, wherein at least one instruction is executed to adjust a programming operation applied to a plurality of memory cells within said array of programmable memory cells if said memory cell logic value content is different than said expected logic value.

24. The machine readable medium of claim 22, wherein at least one instruction is executed to adjust a programming operation applied to only the memory cell having a different logic value content if said memory cell logic value content is different than said expected logic value.

25. The machine readable medium of claim 22, wherein at least one instruction is executed to latch an indicator tag associated with said memory cell having a different logic value if said memory cell logic value content is different than said expected logic value.

26. The machine readable medium of claim 17, wherein said instructions further comprise at least one instruction to apply an adjusted programming pulse to at least one memory cell within said array of programmable memory cells.

* * * * *